United States Patent

Pierson et al.

[11] Patent Number: 5,777,705
[45] Date of Patent: Jul. 7, 1998

[54] WIRE BOND ATTACHMENT OF A LIQUID CRYSTAL DISPLAY TILE TO A TILE CARRIER

[75] Inventors: Mark Vincent Pierson, Binghamton; Steven F. Arndt, Endwell; Michael Anthony Gaynes, Vestal; Lawrence Richard Cutting; David Brian Stone, both of Owego, all of N.Y.

[73] Assignee: International Business Machines Corporation, Armonk, N.Y.

[21] Appl. No.: 865,713

[22] Filed: May 30, 1997

[51] Int. Cl.⁶ .................................................. G02F 1/1345
[52] U.S. Cl. ............................ 349/73; 349/149; 349/158
[58] Field of Search ............................ 349/73, 122, 149, 349/152, 158; 345/206; 445/24

[56] References Cited

U.S. PATENT DOCUMENTS

| | | | |
|---|---|---|---|
| 3,861,783 | 1/1975 | Dill et al. | 349/73 |
| 4,417,392 | 11/1983 | Ibrahim et al. | 29/840 |
| 4,420,767 | 12/1983 | Hodge et al. | 357/81 |
| 4,649,415 | 3/1987 | Hebert | 357/74 |
| 4,706,166 | 11/1987 | Go | 361/403 |
| 4,814,295 | 3/1989 | Mehta | 437/209 |
| 4,832,457 | 5/1989 | Saitoh et al. | 349/73 |
| 4,906,071 | 3/1990 | Takahara et al. | 349/73 |
| 4,979,016 | 12/1990 | Lee | 357/70 |
| 4,982,273 | 1/1991 | Brody | 345/205 |
| 5,086,018 | 2/1992 | Conru et al. | 437/207 |
| 5,091,825 | 2/1992 | Hill et al. | 361/404 |
| 5,106,197 | 4/1992 | Ohuchida et al. | 349/73 |
| 5,227,995 | 7/1993 | Klink et al. | 365/63 |
| 5,291,061 | 3/1994 | Ball | 257/686 |
| 5,323,060 | 6/1994 | Fogal et al. | 257/777 |
| 5,328,079 | 7/1994 | Mathew et al. | 228/180.5 |
| 5,347,428 | 9/1994 | Carson et al. | 361/760 |
| 5,400,157 | 3/1995 | Won | 359/67 |
| 5,444,301 | 8/1995 | Song et al. | 257/737 |
| 5,491,362 | 2/1996 | Hamzehdoost et al. | 257/712 |
| 5,497,258 | 3/1996 | Ju et al. | 359/83 |
| 5,563,470 | 10/1996 | Li | 445/24 |
| 5,673,901 | 10/1997 | Boisdron et al. | 349/73 |

OTHER PUBLICATIONS

Hall et al., "Gold Wire Bonding Onto Flexible Polymeric Substrates", IEEE Trans. Compon. Packag. Manuf. Technol. A, vol. 19, No. 1, Mar. 1996, pp. 12–17. Abstract.

Brathwaite et al., "Assembling MCMs with KGD", Elect. Packag. Prod., vol. 36, No. 1, Jan. 1996, pp. 55–56, 58. Abstract.

Rajeswari et al., "Wire Bond Inspection in IC Assembly", Proc. SPIE, vol. 2665, 1996, pp. 186–196. Abstract.

Kraft et al., "Assembly Techniques for Multichip applications" Electron. Packag. Prod., vol. 35, No. 11, Oct. 1995, pp. 47–48, 50, 52. abstract.

Solberg, "Ball Grid Array Assembly", Surf. Mount Technol., vol. 9, No.8, Aug. 1995, pp. 124, 126, 128, 130. Abstract.

Mara et al. "Stackable Flex Packaging of Chips", TDB, vol. 38, No. 6, Jun. 1995, pp. 1–2. Abstract.

Hall et al. "Gold Wire Bonding onto Flexible Polymeric Substrates", Proceedings Electronic Components and Technology Conference, 1995, pp. 86–90. Abstract.

Eldring et al. "Flip Chip Attachment of Silicon Devices Using Substrate Ball Bumping and the Technology Evaluation on Test Assemblies for 20 Gbit/s Transmission", Proceedings Electronic Components and Technology Conference, 1995, pp. 1209–1216. Abstract.

Mount et al. "Use of Secondary Ion Mass Spectrometry to Investigate Wire Bonding Yield Problems on Gold Contacts", Electronic Packaging Materials Science VII Materials Research Society Symposium Proceedings, Vo. 390, 1995, pp. 245–250. Abstract.

(List continued on next page.)

*Primary Examiner*—Hung X. Dang
*Assistant Examiner*—Tai V. Duong
*Attorney, Agent, or Firm*—Pollock, Vande Sande & Priddy

[57] ABSTRACT

A plurality of liquid crystal display tiles arranged in a matrix are electrically interconnected to a tile carrier by wire bonds.

22 Claims, 2 Drawing Sheets

OTHER PUBLICATIONS

Delivorias et al., "Novel Technique for Known Good Die Processing Eliminates Failure Mechanisms Caused by Traditional KGD Processing", Annual Proceedings —Reliability Physics (Symposium), 1995, pp. 116–123. Abstract.

Agroskin et al, "Reworking Multichip Modules", Electronic Packaging and Production, vol. 35, No. 3, Mar. 1995, pp. 42–45. Abstract.

Anon, "MBGA", Circuits Assembly, vol. 6, No. 3, Mar. 1995, p. 68. Abstract.

Phelan et al. "Card Assembly and Reliability of 44mm Ceramic Solder Column Array Modules", Proceedings of the Technical Program —National Electronic Packaging and Production Conference, vol. 2, 1995, pp. 1048–1058. Abstract.

Zakel et al, "Fluxless Flip Chip Assembly on Rigid and Flexible Polymer Substrates Using the Au–Sn Metallurgy", Proceedings of the IEEE/CPMT International Electronics Manufacturing Technology (IEMT) Symposium, vol. 1, 1994, pp. 177–184. Abstract.

Proietti–Bowne, "Removal of Wire Bond Die Using a Three Step Process", Electro International Conference Proceedings, 1994, pp. 815–819. Abstract.

Heinen et al, "Wire Bonds Over Active Circuits", Proceedings —Electronic Components and Technology Conference, 1994, pp. 922–928. Abstract.

Chrysler et al, "Improved Multi–Mode Cooling System", TDB, vol. 36, No. 6A, Jun. 1993, pp. 155–158. Abstract.

Larson et al, "Development of a Single Point Gold Bump Process for TAB Applications", Proceedings of SPIE, vol. 1986, 1993, pp. 391–397. Abstract.

Chance et al, "Thin Film Metallurgical Structure and Wire for Engineering Change", TDB, No. 1, Jan. 1993, pp. 41–42. Abstract.

Dombroski et al, "Thin Small Outline Packages", TDB, No. 1, Jun. 1991, pp. 358–359. Abstract.

Anon, "Integrated Vertical packaging Technique", Research Disclosure, No. 315, Jul. 1990. Abstract.

Lane et al, "Surface Treatment for Tungsten to Faciliate Wire Bonding", TDB, No. 2, Jul. 1990, p. 89. Abstract.

Noth et al, "Direct Lead Attachment Technology", TDB, No. 12, May 1990, pp. 218–219. Abstract.

Anon, "Organic Card Device Carrier", Research Disclosure, No. 313, May 1990. Abstract.

Anon, "Wire Bonded Captive Accounting Card Assembly Technique", Research Disclosure, No. 299, Mar. 1989. Abstract.

Gruber et al, "Flip–Chip Wire Bond First Level Package", TDB, Mar. 1989, pp. 204–205. Abstract.

Anon, "Hermetic Packaging of J–Wire Leadframes Wire Bonded to Semiconductor Chips having a Central Array of Contacts", Research Disclosure, No. 277, May 1987. Abstract.

Rossi et al, "Mated Array Chip Configuration", TDB, Jul. 1985, pp. 811–812. Abstract.

Goldermans, "Packaging Structure with the Ground Plane on Top of the Wiring", TDB, Jan. 1983, pp. 4418–4420. Abstract.

Rees, "Wiring Cage", TDB, Jan. 1982, pp. 4189–4190. Abstract.

Pagnani, "Chip Bonding Adapter", TDB, Feb. 1980, p. 3990. Abstract.

WIRE BOND ATTACHMENT OF A LIQUID CRYSTAL DISPLAY TILE TO A TILE CARRIER

TECHNICAL FIELD

The present invention is concerned with a liquid crystal display and especially is concerned with providing electrical interconnection between a plurality of liquid crystal display tiles arranged in a matrix to a tile carrier. The present invention is also concerned with the method for fabricating such a liquid crystal display. The present invention is especially concerned with providing a relatively inexpensive interconnection between the liquid crystal display to the base or tile carrier and without requiring any extra wiring on the exterior major surfaces of the liquid crystal display tile.

BACKGROUND ART

Generally, liquid crystal displays are an assembly containing a glass panel unit (which is typically a thin film transistor matrix controlling a liquid crystal emulsion composition contained between transparent plate electrodes typically glass plate electrodes), driver electronics which provide the control signals to the thin film transistor matrix, and a lighting unit placed between the glass panel unit for illuminating the liquid crystal display panel. The glass panel unit typically contains two glass panels: one usually on the bottom and referred to as the panel substrate, constitutes a liquid crystal display panel substrate, upon which the thin film transistor matrix array is deposited. The second glass panel is the cover glass panel located above the panel substrate. This panel is also prepared as an electrode to establish a capacitive indirection with the individual transistors in the thin film transistor matrix on the panel substrate. Between these two glass panels is a liquid crystal material which is subjected to electric fields set up between the transistors and the thin film transistor and the cover glass transparent electrode.

Such liquid crystal displays have been extensively used as monitors for numerous computer applications. Such usage has placed an ever increasing demand for increasing the size of the liquid crystal display. One method to fabricate larger displays is tiling. In tiling, conventional sized (3"×3" or 4"×4") LCD tiles are arranged in a matrix. Typically, driver chips are interconnected to the LCD either directly on the parameter of the display or to flexible tape which is then interconnected to the edge of the LCD.

However, in a tiling concept, edges of an individual LCD tile may be internal to the overall matrix edge.

In addition, the spacing between tiles is a critical parameter to control so as to present a "seamless" look of the tile LCD. Accordingly, the space between tiles must be limited, which in turn restricts the available area for providing electrical interconnection to the tile carrier or base, which in turn is connected electrically to an integrated circuit control card. In certain arrangements, wire bonding has been employed, but such is problematic because of the highly constrained workspace available and because of the need to fabricate two 180° loops in the wire since the surfaces interconnected oppose each other. In particular, in such arrangements, the substrate LCD glass contains a circuit path located on its top major surface, and a circuit path located on its bottom major surface, which both circuit paths need to be electrically interconnected.

Accordingly, room for improvement for bonding liquid crystal display tiles to a base exists in the industry.

SUMMARY OF INVENTION

The present invention is concerned with an electrical interconnection between the liquid crystal display tile to the base or tile carrier that is relatively efficient, readily fabricated, and relatively inexpensive, as well as requiring limited real estate. In addition, the present invention provides an electrical interconnection that does not require extra wiring or circuitry on the exterior major surfaces of the LCD tile. In particular, the present invention is concerned with a liquid crystal display that comprises a plurality of liquid crystal display tiles arranged in a matrix electrically connected to a tile carrier. Each of the liquid crystal display tiles of the matrix is attached to the tile carrier with an adhesive and is electrically interconnected to the tile carrier by wire bonds present on at least one side and extending to the tile carrier.

In addition, the present invention is directed to a method for fabricating the above disclosed liquid crystal display. The method comprises the steps of providing adhesive on the bottom of the tile or on the tile carrier where the tile is to be attached or both, placing the tile on the desired location on the tile carrier, and then providing wire bonds on the tile and connecting the wire bonds to an interior surface of the tile carrier; next, repeating the above steps for a second level of tiles, and repeating the above steps until the desired number of levels of tiles are electrically interconnected to the tile carrier in the desired matrix formation.

Still other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BEST AND VARIOUS MODES FOR CARRYING OUT INVENTION

Figure 1:
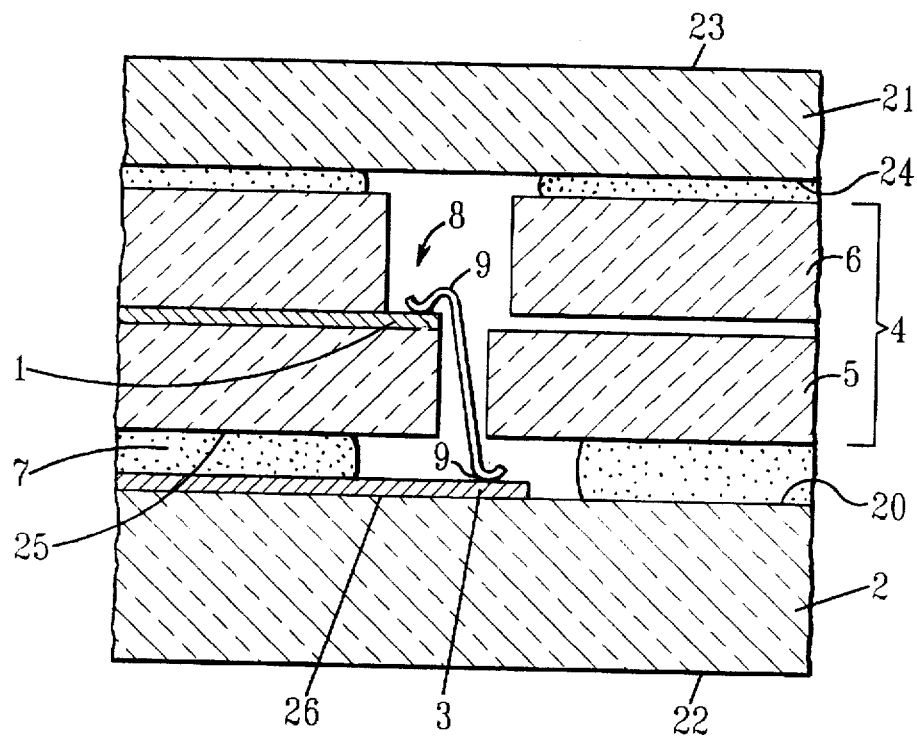
FIG. 1 is a cross-section schematic view of two adjacent tiles wire bonded to a tile carrier pursuant to the present invention.

In order to facilitate an understanding of the present invention, reference will be made to the figures wherein the same number means the same item in different view. In particular, FIG. 1 illustrates the tile carrier which typically is a glass carrier having provided thereon electrical contact pads 3. These contact pads and circuit path or conductive sites are wire bond compatible surfaces and typically are chrome/copper, nickel/gold or aluminum. The conductive pads 3 are usually about 0.004" to about 0.012" in width and about 0.0002" to about 0.002" in thickness. Numeral 4 represents the liquid crystal display tile.

The liquid crystal display tile 4 contains two optically clear pieces 5 and 6 which are typically glass. Glass 5 includes a circuit path 1 thereby providing tile 4 with a circuit path 1 on its middle surface. A ledge portion 8 remains available for bonding on tile 5. Such ledge portion can be indium tin oxide. Typically, the spacing or width of the ledge 8 is about 2 to about 4 mils. Typically its depth is about 4–30 mils. The LCD tile is bonded to an interior surface 20 of the tile carrier by an adhesive or adhesive layer 7. The adhesive can be initially placed on the bottom 25 of the LCD tile and/or on the desired top portion of the tile carrier surface 20.

The adhesive is preferably optically clear and typically includes epoxy resin compositions, acrylics, polyurethanes and silicones. Typically silicones include Dow Corning HIPEC 649 and HIPEC X3-6930. In the event it is desired to use an adhesive that is not optically clear, then such would not be applied as a continuous layer. Instead, it would be provided in the nature of spaced dots located between pixels.

The thickness of the adhesive typically formed in a bump or surface is about 1 to about 10 mils thick and provides clearance above the tile carrier 2 for the wire 10 to be placed beneath an adjacent tile. The adhesive is typically cured by employing temperatures of about 20° C. to about 100° C. for about 1 hour to about 24 hours. The adhesive can also be cured using UV light or visible light. After curing, the wire bonds 9 are adhered to at least one side of the tile and preferably to two contiguous or intersecting sides of the tile as shown in FIG. 1. The wire is typically gold or aluminum and is adhered to the contiguous sides of the tile by conductive sites, such as an aluminum site and upon heating, a eutectic is formed that unites the aluminum site with the gold wire.

The tile carrier includes a top cover plate 21 and a bottom cover plate 2. The bottom cover plate of the tile carrier has an exterior or external surface 22 and interior surface 20. The top cover plate 21 of the tile carrier has an external major surface 23 and interior major surface 24. The wire 9 is bonded to a conductive pad 3 such as indium tin oxide located on glass surface 20 of bottom cover plate 2 or to a conductive pad located on glass surface 24 of top cover plate 21. The surface 20 or 24 to which wire 9 is bonded contains electrical circuitry 26 to provide for the electrical escape to the edge of the glass plate and connection to an external circuit board or card (not shown).

Figure 3:
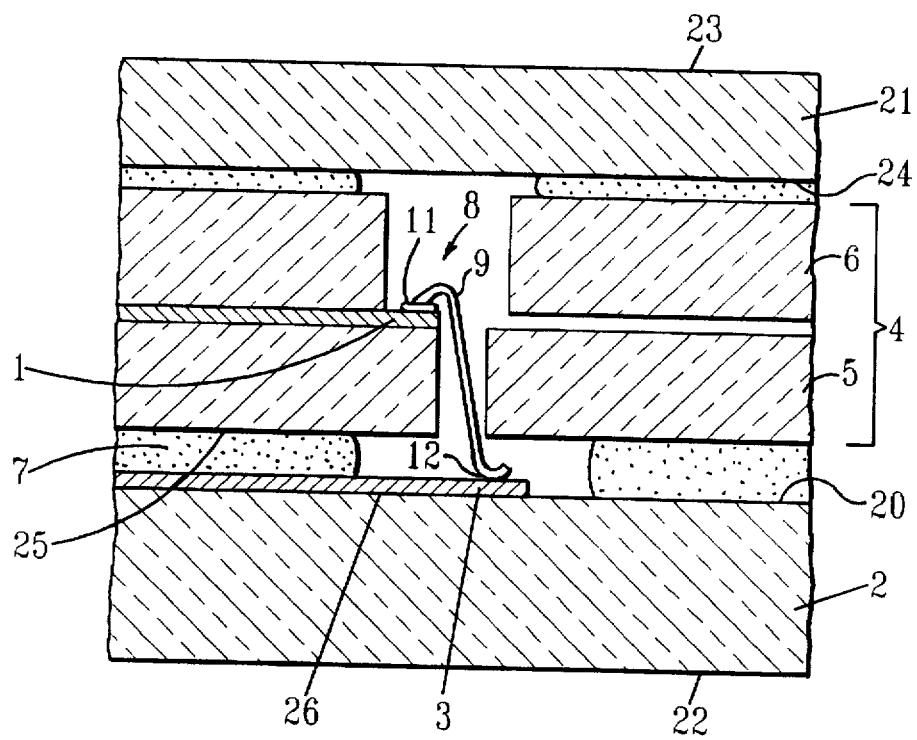
FIG. 3 is a cross-section schematic view of the adjacent tiles bonded to a tile carrier pursuant to another embodiment of the present invention.

FIG. 3 illustrates an alternative bonding method for wire 9 whereby a typical ball bond 11 is provided on ledge 8. Wire 9 is also bonded at 12 to the pad 3 and in turn to circuitry 26 that provides the wiring escape to the edge of the glass plate and then connected to a circuit board or card (not shown).

A dielectric coating (not shown) is preferably applied to the wire. Suitable encapsulating dielectric coatings are optically clear and include epoxy compositions and silicones. Suitable silicones are the high performance semiconductor protective materials from Dow Corning, such as HIPEC 649 or HIPEC X3-6930.

Figure 2:
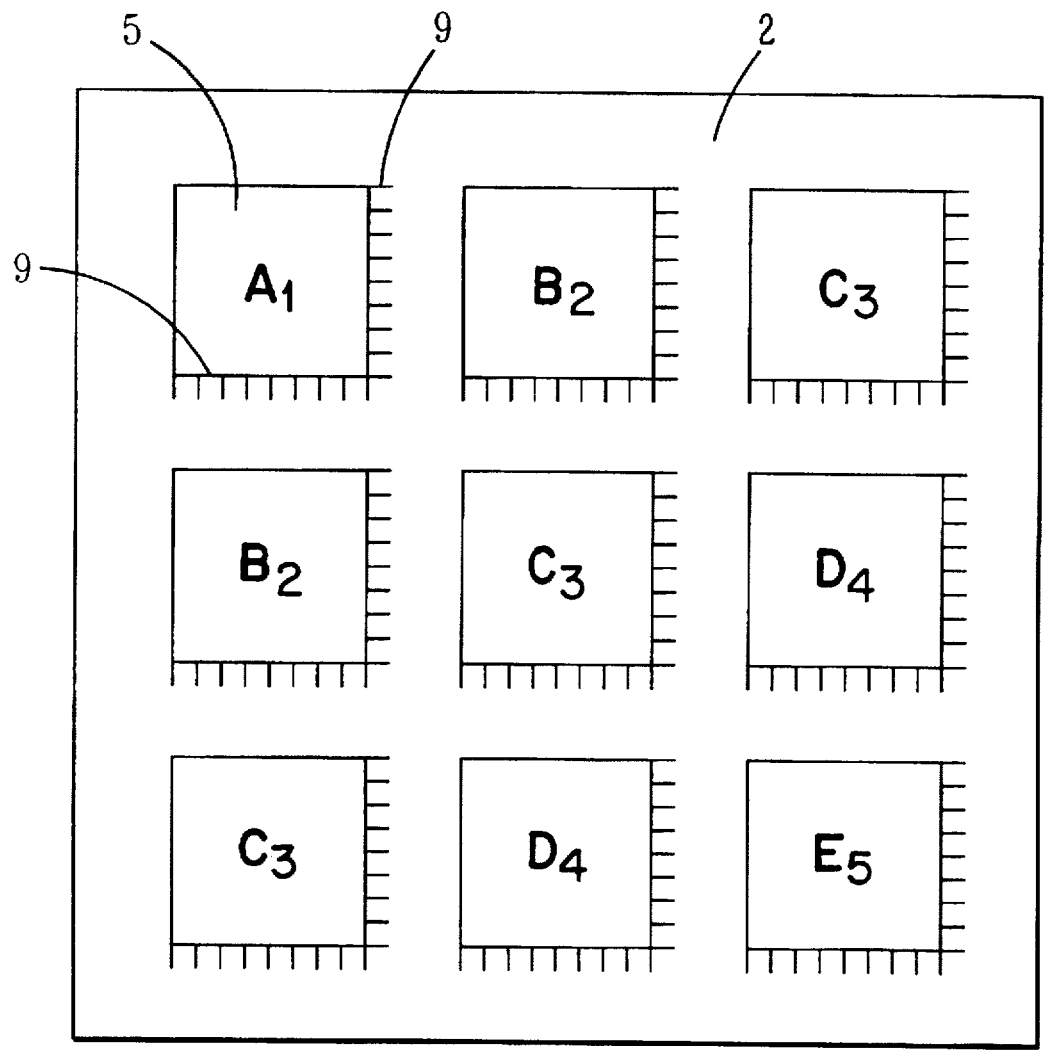
FIG. 2 is a top view of a liquid crystal display tile matrix according to the present invention.

The above sequence is repeated by applying the next level of tile and so forth until the desired number of LCD tiles in the desired matrix is provided. By way of example, see FIG. 2 which illustrates a first level of tiles A, a second layer of tiles B, a third level of tiles C, a fourth level of tiles D and a fifth level of tiles E. Of course, the method of the present invention is suitable for any number of tiles in a matrix typically greater than a 2×2 matrix since such would not require the type of bonding here, since all of the tiles would have external connection to the edge of the tile carrier.

The wire employed is generally about 0.5 mils to about 2 mils, typically about 0.8 mils to about 1.5 mils, more typically about 1.0 mils in diameter, and typically about 20 mils to about 50 mils, and preferably about 35 mils in length. The spacing between adjacent tiles is typically about 1.5 to about 6 mils and more typically about 3.5 mils, a specific example being about 2 mils. The wire is typically bent at about 180° turn at its top portion and about an 180° turn at its bottom portion in the opposite direction. As noted, the wire at the bottom portion is located beneath an adjacent tile.

In this disclosure, there are shown and described only the preferred embodiments of the invention, but, as aforementioned it is to be understood that the invention is capable of use in various other combinations and environments and is capable of changes or modifications within the scope of the inventive concept as expressed herein.

What is claimed is:

1. A liquid crystal display comprising a plurality of liquid crystal display tiles arranged in a matrix electrically interconnected to a tile carrier, wherein each of said liquid crystal display tiles is attached to said tile carrier with an adhesive and is electrically interconnected to said tile carrier by wire bonds on at least one side of each of said liquid crystal display tiles and extending to said tile carrier.

2. The liquid crystal display of claim 1 wherein more than a 2×2 matrix is employed.

3. The liquid crystal display of claim 1 wherein the wire is gold or aluminum.

4. The liquid crystal display of claim 1 wherein the wire bonds are encapsulated in a dielectric encapsulating composition.

5. The liquid crystal display of claim 1 wherein the external major surfaces of the tile are free of circuitry.

6. The liquid crystal display of claim 1 wherein the wire is about 0.5 to about 2 mils in diameter.

7. The liquid crystal display of claim 1 wherein the wire is bonded to the liquid crystal display tile on a ledge of about 4 to about 30 mils wide.

8. The liquid crystal display of claim 1 wherein the bonding wire from one liquid crystal display tile attached to the tile carrier is located beneath an adjacent liquid crystal display tile.

9. The liquid crystal display of claim 1 wherein the tile-to-tile spacing is about 2 to about 6 mils.

10. The liquid crystal display of claim 1 wherein the conductive sites for attaching the wire on said tile is indium tin oxide.

11. The liquid crystal display of claim 1 wherein said tile carrier comprises a top cover plate and a bottom cover plate and wherein said tiles are bonded on interior surface of the bottom cover plate.

12. The liquid crystal display of claim 1 wherein said wire bonds are provided of two contiguous sides of each of said liquid crystal display tiles.

13. The liquid crystal display of claim 1 wherein said tile carrier comprises a top cover plate and a bottom cover plate and wherein said tiles are bonded on interior surface of the top cover plate.

14. A method for fabricating a liquid crystal display comprising a plurality of liquid crystal display tiles arranged in a matrix electrically connected to a tile carrier having a top cover plate and a bottom cover plate which comprises providing a circuit path located on an interior major surface of the top cover plate or bottom cover plate;

providing adhesive on the bottom of the tile or on the tile carrier where said tile is to be placed;

placing said tile on said tile carrier providing said adhesive between the bottom surface of said tile and said tile carrier;

providing wire bonds on a ledge of at least one side of the tile and electrically interconnecting the wire to a conductive site on the surface of the tile carrier; also containing said circuit path;

repeating the above steps for a second tile and continuing the sequence of steps until the desired number of tiles are provided.

15. The method of claim 14 wherein said matrix is greater than a 2×2 matrix.

16. The method of claim 14 wherein the bonding wire from one liquid crystal display tile attached to said tile carrier is located beneath an adjacent liquid crystal display tile.

17. The method of claim 14 wherein the tile-to-tile spacing is about 2 to about 6 mils.

18. The method of claim 14 wherein the external major surfaces of the liquid crystal tiles are free of circuitry.

19. The method of claim 14 wherein said wire is gold or aluminum.

20. The method of claim 14 wherein the wire bonds are encapsulated in a dielectric encapsulating composition.

21. The method of claim 14 wherein the wire is bonded to the liquid crystal tile on a ledge of about 2 to about 4 mils wide.

22. The method of claim 14 which further comprises providing wire bonds on a ledge of two contiguous sides of the tile.

* * * * *